United States Patent
Noguchi et al.

(10) Patent No.: US 9,412,443 B2
(45) Date of Patent: Aug. 9, 2016

(54) PROCESSOR SYSTEM HAVING VARIABLE CAPACITY MEMORY

(71) Applicant: KABUSHIKI KAISHA TOSHIBA, Minato-ku (JP)

(72) Inventors: Hiroki Noguchi, Yokohama (JP); Shinobu Fujita, Inagi (JP); Keiko Abe, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 336 days.

(21) Appl. No.: 14/205,817

(22) Filed: Mar. 12, 2014

(65) Prior Publication Data
US 2014/0281189 A1 Sep. 18, 2014

(30) Foreign Application Priority Data
Mar. 15, 2013 (JP) ................. 2013-053661

(51) Int. Cl.
| | |
|---|---|
| G06F 13/00 | (2006.01) |
| G11C 13/00 | (2006.01) |
| G06F 9/44 | (2006.01) |
| G11C 14/00 | (2006.01) |
| G11C 11/00 | (2006.01) |

(52) U.S. Cl.
CPC ............ *G11C 13/004* (2013.01); *G06F 9/4403* (2013.01); *G11C 13/0002* (2013.01); *G11C 13/0023* (2013.01); *G11C 13/0069* (2013.01); *G11C 14/0081* (2013.01)

(58) Field of Classification Search
CPC ................................ G06F 13/00; G11C 11/00
USPC ................... 711/104, 154; 365/148; 710/62
See application file for complete search history.

(56) References Cited

U.S. PATENT DOCUMENTS

| | | | | | |
|---|---|---|---|---|---|
| 6,717,881 | B2 * | 4/2004 | Ooishi | .................. | G11C 5/063 257/E21.679 |
| 7,002,874 | B1 * | 2/2006 | Parris | ....................... | G11C 8/10 365/187 |
| 7,280,391 | B2 * | 10/2007 | Kang | .................. | G11C 7/1027 365/148 |
| 8,400,804 | B2 * | 3/2013 | Tang | ....................... | G11C 5/02 365/226 |

(Continued)

FOREIGN PATENT DOCUMENTS

| | | |
|---|---|---|
| JP | 2003-30047 A | 1/2003 |
| JP | 2004-127347 A | 4/2004 |

(Continued)

OTHER PUBLICATIONS

Office Action issued Nov. 12, 2013, in Japanese Patent Application No. 2013-053661 with English translation.

*Primary Examiner* — Christopher Shin
(74) *Attorney, Agent, or Firm* — Oblon, McClelland, Maier & Neustadt, L.L.P.

(57) ABSTRACT

According to one embodiment, a processor system includes a variable capacity memory. The memory includes a memory cell array including basic units, each of the basic units including one cell transistor and one variable resistance element, a mode selector switching between first and second modes, a read/write of one bit executed in $2^n$ basic units (n is an integer) among the basic units in the first mode, the read/write of the one bit executed in $2^m$ basic units (m is an integer, m≠n) among the basic units in the second mode, and a control circuit which controls the switching between the first and second modes.

20 Claims, 10 Drawing Sheets

(56) References Cited

U.S. PATENT DOCUMENTS

| | | | | |
|---|---|---|---|---|
| 2002/0176311 A1* | 11/2002 | Kurjanowicz | ........ | G11C 7/1045 365/230.06 |
| 2003/0018861 A1* | 1/2003 | Micheloni | ........... | G06F 11/1072 711/154 |
| 2005/0174841 A1* | 8/2005 | Ho | ........................ | G11C 11/56 365/185.03 |
| 2006/0083098 A1* | 4/2006 | Ho | ....................... | G11C 7/1006 365/230.05 |
| 2008/0089146 A1* | 4/2008 | Fujito | ...................... | G11C 7/04 365/190 |
| 2009/0067229 A1* | 3/2009 | Kang | ....................... | G11C 8/06 365/163 |
| 2011/0063897 A1 | 3/2011 | Ong | | |
| 2012/0099364 A1* | 4/2012 | Park | ................... | G11C 13/0069 365/148 |
| 2014/0169077 A1* | 6/2014 | Kolar | ................... | G11C 11/419 365/156 |
| 2016/0049191 A1* | 2/2016 | Siddiqui | ............... | G11C 11/419 365/154 |

FOREIGN PATENT DOCUMENTS

| | | |
|---|---|---|
| JP | 2007-323706 | 12/2007 |
| JP | 2009-64498 A | 3/2009 |
| JP | 2011-508356 A | 3/2011 |
| JP | 2011-192345 | 9/2011 |

\* cited by examiner

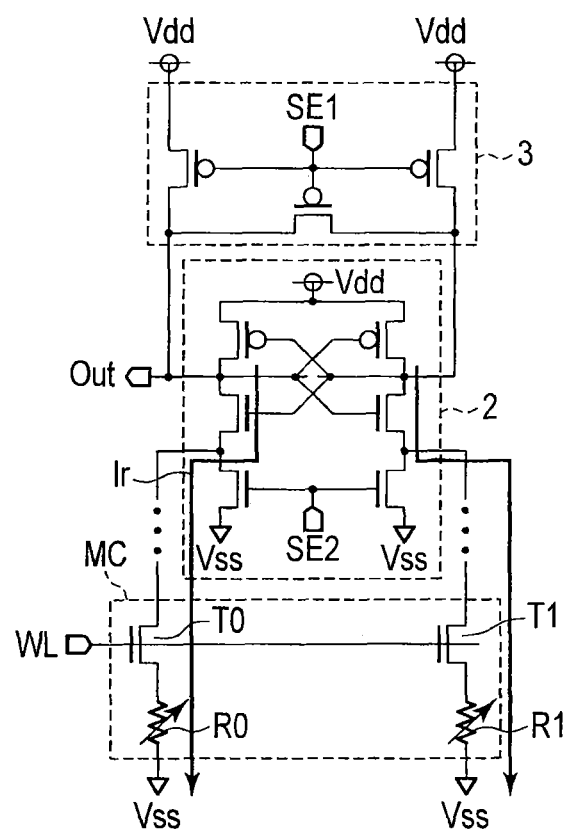
F I G. 5

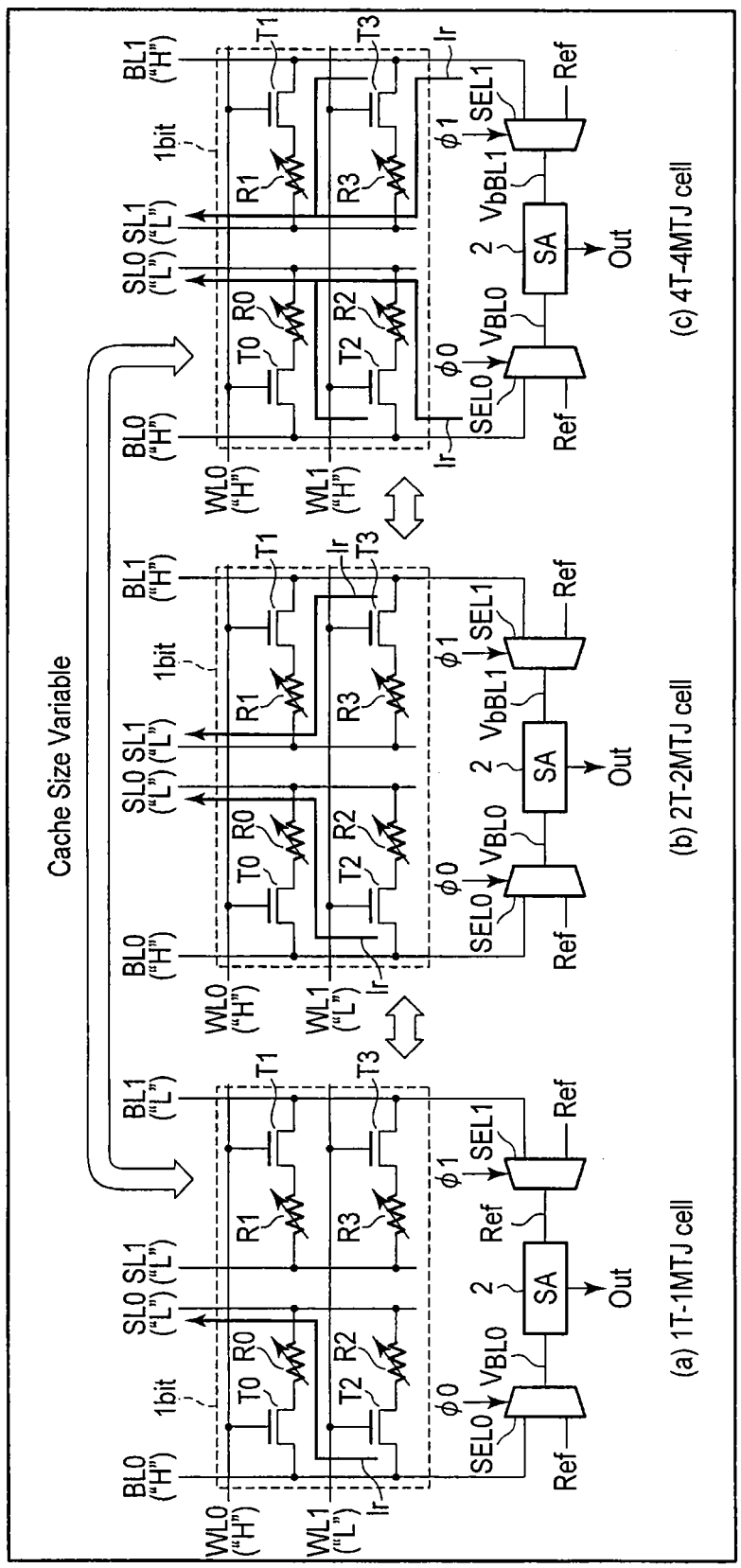
F I G. 8

PROCESSOR SYSTEM HAVING VARIABLE CAPACITY MEMORY

CROSS-REFERENCE TO RELATED APPLICATIONS

This application is based upon and claims the benefit of priority from Japanese Patent Application No. 2013-053661, filed Mar. 15, 2013, the entire contents of which are incorporated herein by reference.

FIELD

Embodiments described herein relate generally to a processor system having a variable capacity memory.

BACKGROUND

Attempts have been made to realize a power saving processor by utilizing a magnetic random access memory (MRAM) as a cache memory. However, compared to a static random access memory (SRAM) as a conventional cache memory, the MRAM is slow in operation speed. Therefore, a cell configuration for realizing high-speed operation is now being developed.

Further, in processors for use in, for example, mobile products, remarkable enhancement in functionality has been recently made in addition to power saving. Because of this, different types of functionality or performance are required for different applications.

BRIEF DESCRIPTION OF THE DRAWINGS

FIG. 5 is a diagram showing a sense amplifier in FIG. 2;
FIG. 8 is a diagram showing an operation principle of MRAM in FIG. 7.

DETAILED DESCRIPTION

Figure 1:
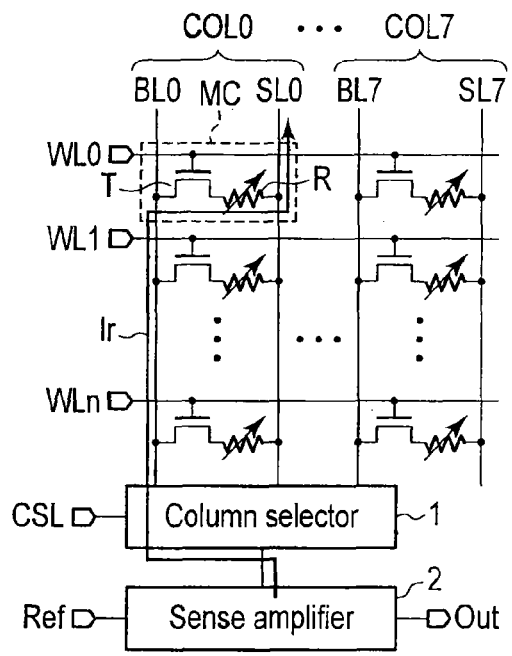
FIG. 1 is a diagram showing a 1T-1MTJ type STT-MRAM.

In general, in accordance with one embodiment, a processor system comprises: a variable capacity memory; and a processor which instructs a read/write of one bit to the variable capacity memory. The variable capacity memory comprises: a memory cell array including basic units, each of the basic units including one cell transistor and one variable resistance element; a mode selector switching between first and second modes, a read/write of one bit executed in $2^n$ basic units (n is an integer) among the basic units in the first mode, the read/write of the one bit executed in $2^m$ basic units (m is an integer, m≠n) among the basic units in the second mode; and a control circuit which controls the switching between the first and second modes.

Embodiments will be described with reference to the accompanying drawings.

1. Outline

In the embodiments below, a variable capacity memory capable of selectively changing the memory capacity (or operation speed) will now be proposed. Since a change in memory capacity is realized by changing (reconfiguring) a cell configuration for storing 1 bit, the variable capacity memory can be called a variable cell-configurable memory. The variable capacity memory described below mainly relates to a nonvolatile memory for storing data in a variable resistance element. However, for facilitating the description, an embodiment of a Spin Transfer Torque (STT)-MRAM whose application to a cache memory is most expected, for example, will be described.

The STT-MRAM in which the memory capacity (or cell configuration) is reconfigurable, described below, will hereinafter be referred to as a variable capacitance STT-MRAM. The variable capacitance STT-MRAM is characterized in that an advanced perpendicular magnetic tunnel junction (Advanced p-MTJ), for example, is used as a memory element, which enables the device to deal with applications of from a small capacity to a large capacity, using one circuit configuration (one chip), i.e., without redesigning the device.

Further, in the embodiments below, adaptive storage control (ASC) cache architecture using the variable capacitance STT-MRAM will be also proposed. The adaptive storage control cache architecture can make the most use of the above-mentioned variable capacitance STT-MRAM.

The following three points will now be mainly proposed in the embodiments.

Firstly, the design (circuit configuration) of the variable capacitance STT-MRAM will be proposed.

In general, in MRAMs, the memory capacity and the operation speed are in trade-off relationship. In contrast, in variable capacitance STT-MRAMs, the memory capacity and the operation speed can be varied selectively in accordance with applications, and hence power saving and high performance can simultaneously be realized.

For instance, when the variable capacitance STT-MRAM is applied to an L2 cache memory, an optimal cache capacity is selected by the operating system (OS). Namely, if the application currently executed regards the operation speed (latency) as important, the cache capacity of the variable capacitance STT-MRAM is reduced to thereby enhance the operation speed. In contrast, if the currently executed application regards the cache capacity as important, the cache capacity of the variable capacitance STT-MRAM is increased.

Thus, the variable capacitance STT-MRAM exhibits advantage for both the application regarding the operation speed, and the application regarding cache capacity as important.

Secondly, adaptive storage control cache architecture for making the most use of the variable capacitance STT-MRAM will be proposed.

The variable capacitance STT-MRAM can maximize its performance as a cache memory by selecting an optimal cache capacity in accordance with the currently executed application. Namely, in the application, the variable capacitance STT-MRAM determines an access pattern to a cache memory, and selects the cache capacity based on the determination result.

For instance, adaptive storage control cache architecture will be proposed, in which several operation phases are selected from an access pattern to the cache memory, and the cache capacity is dynamically varied in accordance with transition between the operation phases.

Thirdly, a method for varying the cache capacity in accordance with addresses in the cache memory, based on the fact that the memory access pattern varies in accordance with variables used in applications, will be proposed.

This method has been contrived, considering that when access has concentrated on a predetermined tag address, rush may occur due to thrashing. To avoid this, the way number of the cache memory is made variable for each phase (set) of an application, enabling selection of an optimal way number corresponding to an access pattern for each application phase (set).

For instance, in the application phase in which the operation speed (latency) is regarded as important, the cache capacity is reduced to thereby realize high-speed memory access. In contrast, in the application phase in which the cache capacity is regarded as important, the cache capacity is increased.

Regarding the operation speed as important means that a latency penalty (reduction of the operation speed), which will occur in the cache memory when the probability (hitting probability) of existence of data to access is high, and data is acquired from a DRAM as a main memory, even if the cache capacity is reduced, is regarded as more important than a miss penalty that no data to access exists in the cache memory.

Namely, when hitting probability in a cache memory of a small capacity is high, there is little access to the main memory, and therefore maximizing the operation speed of the cache memory results in high-speed operation of the entire system.

Further, regarding the memory capacity (cache capacity) as important means that miss penalty (reduction of the operation speed) indicating that when the cache capacity is reduced, the probability (miss probability) of nonexistence of data to access in the cache memory is high is regarded as more important than the latency penalty that the operation speed of the MRAM as the cache memory is reduced.

Namely, when the miss probability of the small-capacity cache memory is high, maximizing the cache capacity even by reducing the operation speed of the cache memory will lead to elimination of access to the main memory, which contributes to high-speed operation of the entire system.

2. Simulation of Read Speed

In the simulation described below, the circuit configuration and read speed of the STT-MRAM will be described.

Figure 2:
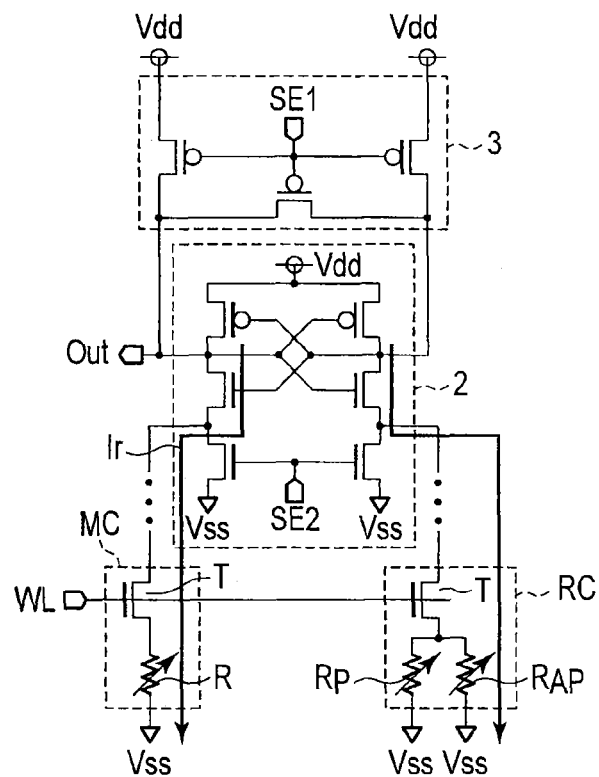
FIG. 2 is a diagram showing a sense amplifier in FIG. 1.

FIG. 1 is a circuit diagram showing a 1T-1MTJ type STT-MRAM. FIG. 2 is a circuit diagram showing a sense amplifier used to read data from the memory cell array of FIG. 1.

As shown, each memory cell MC comprises a cell transistor (FET) T and an MTJ element R.

The gate of the cell transistor T is connected to a word line WLi (i=one of 0-n). The memory cell MC is connected between a bit line BLj and a source line SLj (j=one of 0-7). A column selector 1 selects one of eight columns COL0-COL7 based on a column selection signal CSL. The bit line BLj in the selected column COLj is electrically connected to a sense amplifier 2.

The sense amplifier 2 compares the potential of the bit line BLj with a reference potential Reference, thereby determining data in the selected memory cell MC and outputting read data OUT. The sense amplifier 2 is initialized by an initializing circuit (precharge/equalize circuit) 3. When a control signal SE1 is at "L," the sense amplifier 2 is initialized, while when a control signal SE2 is at "H," the sense amplifier 2 is activated.

In the simulation, a cell transistor T in a reference cell RC is connected to the word line WLi connected to the selected memory cell MC. The reference cell RC comprises an MTJ element $R_P$ in a parallel state (P) and an MTJ element $R_{AP}$ in an anti-parallel state (AP), and therefore generates the reference potential Ref.

In the STT-MRAM described above, it is necessary to reduce read power in order to reduce dynamic power. However, if a read current Ir is reduced to reduce the read power, the read speed is inevitably reduced (read delay is increased).

Figure 3:
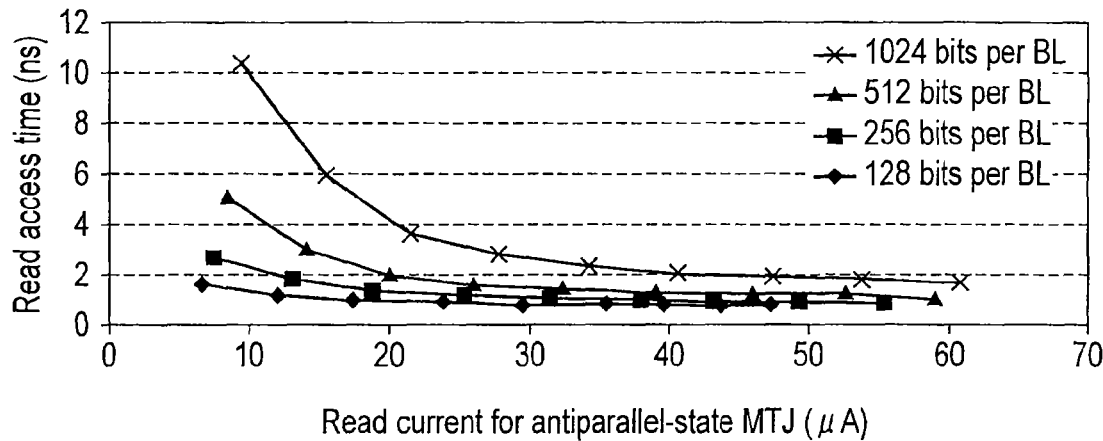
FIG. 3 is a diagram showing a relationship between a read current and an access time.

To check the relationship between the read current and the read delay, simulation was carried out using the circuit shown in FIGS. 1 and 2. FIG. 3 shows the simulation result.

In FIG. 3, the horizontal axis indicates read current, and the vertical axis indicates read access time. The read current is that used to read out data from an MTJ element in an anti-parallel state. The read access time indicates the time required for the sense amplifier to output data after the potential of the selected word line reaches half (Vdd/2) a power supply potential Vdd.

Further, the number (bit number) of bit cells connected to a bit line was employed as a parameter. In the simulation, the number (array structure) of memory cells connected to a bit line was set to 128 bits, 256 bits, 512 bits and 1024 bits.

According to the simulation based on a circuit level using SPICE, to realize a read access time of 2 ns, read currents of 8 µA, 13 µA, 20 µA and 50 µA were required for the four array structures of 128 bits, 256 bits, 512 bits and 1024 bits.

It can be understood from this simulation result that for a greater array structure, a greater amount of read current is required to maintain a predetermined read speed. This means that in order to maintain the predetermined read speed, there is an upper limit for the number of memory cells that can be connected to a bit line. This leads to area penalty.

In an MRAM with a memory macro having a capacity of several megabits, area efficiency is an important design factor. Therefore, in order to enhance the area efficiency, it is important to design each central transistor as small as possible under the design rule.

Figure 4:
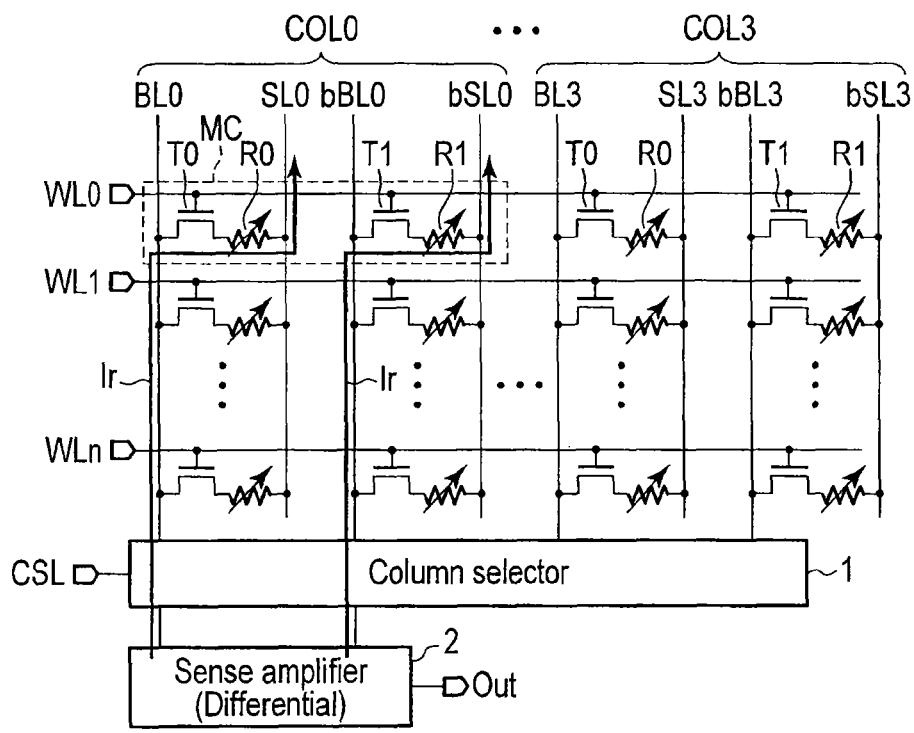
FIG. 4 is a diagram showing a 2T-2MTJ type STT-MRAM.

FIG. 4 shows an example of the memory cell array of a 2T-2MTJ type STT-MRAM, and FIG. 5 shows an example of a sense amplifier used to read data from the memory cell array of FIG. 4.

As shown, each memory cell MC comprises two cell transistors (FET) T0 and T1, and two MTJ elements R0 and R1.

The gates of the cell transistors T0 and T1 are connected to one of the word lines WLi (i=one of 0-n). Each memory cell MC is connected between the bit line BLj/bBLj and the source line SLj/bSLj (j=one of 0-3). A column selector 1 selects one of the four columns COL0-COL3, based on a column selection signal CSL. The bit line BLj in the selected column COLj is electrically connected to the sense amplifier 2.

The sense amplifier 2 compares the potential of the bit line BLj with the potential of the bit line bBLj, thereby outputting read data OUT. The sense amplifier 2 is initialized by an initializing circuit (precharge/equalize circuit) 3. When a control signal SE1 is at "L," the sense amplifier 2 is initialized, while when a control signal SE2 is at "H," the sense amplifier 2 is activated.

In the simulation, complementary data are stored in the two MTJ elements R0 and R1 in one memory cell MC. Namely, one of the two MTJ elements R0 and R1 is set in a parallel state (e.g., a low resistance state), and the other is set in an anti-parallel state (e.g., a high resistance state). As a result, during reading, a differential reading in which the potential of the bit line BLj is compared with the potential of the bit line bBLj is enabled, thereby realizing a high-speed reading operation compared to the array structure shown in FIGS. 1 and 2.

However, the memory cell size required to store 1 bit is twice the cell size of the array structure shown in FIGS. 1 and 2. This is disadvantageous to increase the cache capacity. Further, it is necessary to guide read currents to the two MTJ elements R0 and R1 during reading, although the read access time can be enhanced because a read margin is enhanced.

3. Basic Structure

Figure 6:
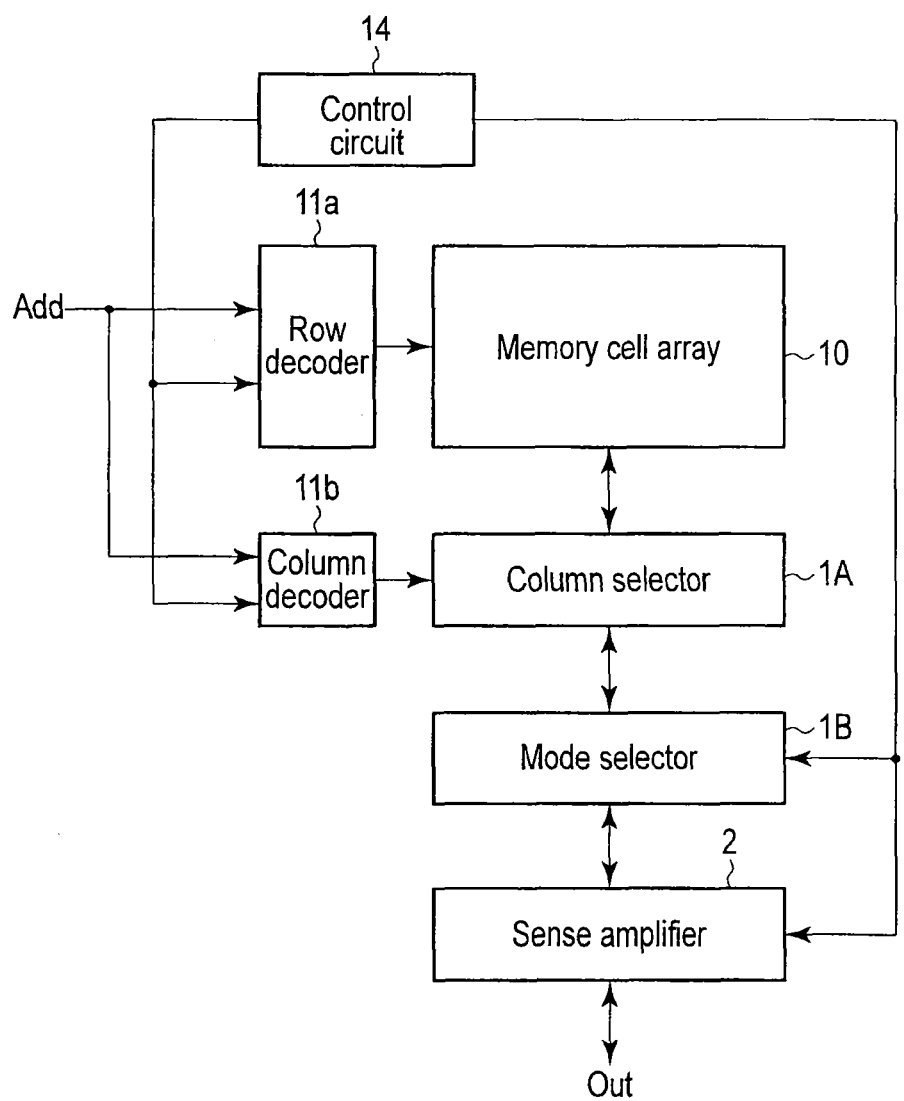
FIG. 6 is a diagram showing an entire configuration of a variable capacitance STT-MRAM.

FIG. 6 shows the entire configuration of the variable capacitance STT-MRAM.

As shown, a memory cell array 10 comprises an array of MTJ elements (memory cells). A row decoder 11a and a column decoder 11b randomly access the MTJ elements in the memory cell array 10, based on an address signal Add.

A column selector 1A serves to electrically connect the memory cell array 10 to the sense amplifier 2 based on a signal from the column decoder 11b. A mode selector 1B serves to change the basic unit (cell configuration) for performing reading/writing of 1 bit (data). The sense amplifier 2 is used to read data Out from the memory cell array 10.

A control circuit 14 controls the operations of the row decoder 11a, the column decoder 11b, the mode selector 1B and the sense amplifier 2. For instance, the control circuit 14 executes adaptive storage control described below under the control of a cache controller (CPU).

The positional relationship between the column selector 1A and the mode selector 1B may be opposite.

Figure 7:
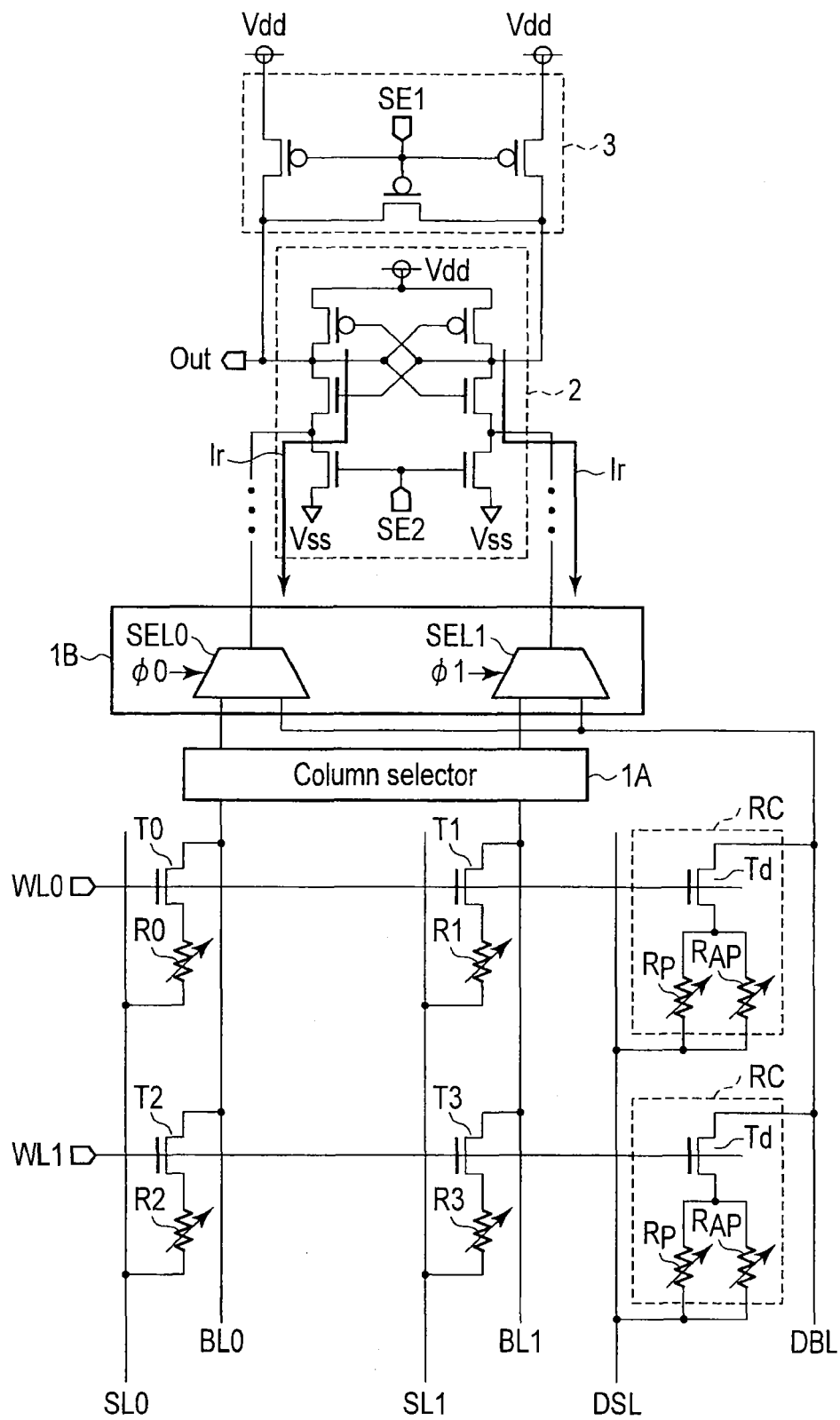
FIG. 7 is a diagram showing a switching section in a cell configuration of the variable capacitance STT-MRAM.

FIG. 7 shows a cell configuration switching section incorporated in the variable capacitance STT-MRAM.

As shown, the memory cell array comprises central transistors T0, T1, T2 and T3, and MTJ elements R0, R1, R2 and R3.

The gates of the cell transistors T0 and T1 are connected to a word line WL0, and the gates of the cell transistors T2 and T3 are connected to a word line WL1. The central transistors T0, T1, T2 and T3 are connected in series to the MTJ elements R0, R1, R2 and R3, respectively.

The cell transistors T0 and T2 are connected to a bit line BL0, and the MTJ elements R0 and R2 are connected to a source line SL0. The central transistors T1 and T3 are connected to a bit line BL1, and the MTJ elements R1 and R3 are connected to a source line SL1.

The bit lines BL0 and BL1 are connected to the mode selector 1B (SEL0, SEL1) via the column selector 1A.

A reference cell RC comprises a central transistor Td, an MTJ element $R_P$ in a parallel state (P) and an MTJ element $R_{AP}$ in an anti-parallel state (AP), the MTJ element $R_P$ and the MTJ element $R_{AP}$ being connected in parallel. The central transistor Td is connected to a dummy bit line DBL, and the MTJ element $R_P$ and the MTJ element $R_{AP}$ are connected to a dummy source line DSL.

The dummy bit line DBL is connected to the mode selector 1B (SEL0, SEL1).

Based on a control signal $\phi 0$, the mode selector SEL0 transfers the potential $V_{BL0}$ no of the bit line BL0 or the reference potential Ref of the dummy bit line DEL to the sense amplifier 2. Similarly, based on a control signal $\phi 1$, the mode selector SEL1 transfers the potential $V_{BL1}$ of the bit line BL1 or the reference potential Ref of the dummy bit line DEL to the sense amplifier 2.

The sense amplifier 2 compares the output of the mode selector SEL0 with the output of SEL1, thereby determining data in the selected memory cell MC and outputting read data OUT. The sense amplifier 2 is initialized by an initializing circuit (precharge/equalize circuit) 3. When a control signal SE1 is at "L," the sense amplifier 2 is initialized, while when a control signal SE2 is at "H," the sense amplifier 2 is activated.

In the above-described variable capacitance STT-MRAM, the configuration (operation mode) of each memory cell MC can be selected from (a) a 1T-1MTJ cell mode, (b) a 2T-2MTJ cell mode, and (c) a 4T-4MTJ cell mode, as is shown in FIG. 8.

Since the memory cell size required for storing 1 bit differs between the three operation modes, the read speed (read delay) differs therebetween. Table 1 below shows differences between the modes.

TABLE 1

| Mode | Read mechanism | Current | Capacity | Sense margin |
|---|---|---|---|---|
| 1T-1MTJ | With reference | 1 | ×4 | Low |
| 2T-2MTJ | Without reference | 1 | ×2 | Middle |
| 4T-4MTJ | Without reference | 2 | ×1 | High |

In the 1T-1MTJ cell mode, the reference potential Ref (With reference) is used as a read mechanism. In contrast, in the 2T-2MTJ and 4T-4MTJ cell modes, the reference potential Ref is not used because differential read is employed as the read mechanism (Without reference).

Table 1 shows the comparison results obtained when the read current in the 1T-1MTJ cell mode is set to 1, and the memory capacity (this is inversely proportional to the cell size) in the 4T-4MTJ cell mode is set to 1.

In the 1T-1MTJ cell mode, the memory cell size is minimum, and the memory capacity is four times that in the 4T-4MTJ cell mode. However, since the read current is small, the sense margin is low (Low).

In the 4T-4MTJ cell mode, since the memory cell size is maximum and the read current is large, the sense margin is high (High). However, the memory capacity is ¼ of that in the 1T-1MTJ cell mode, since the memory cell size is large.

Further, in the 2T-2MTJ cell mode, the intermediate properties between the 1T-1MTJ cell mode and the 4T-4MTJ cell mode are exhibited. Namely, the memory capacity is twice that in the 4T-4MTJ cell mode and the sense margin is middle (Middle).

Switching of these modes is executed by, for example, a cache controller in accordance with a currently executed application. As a result, both power saving and high performance can be realized in the MRAM cache.

Although the basic structure employs three cell configurations (operation modes), i.e., (a) the 1T-1MTJ cell mode, (b) the 2T-2MTJ cell mode, and (c) the 4T-4MTJ cell mode, it is not limited to this. For instance, other xT-xMTJ (x is an even number) cell configurations (modes), such as a 6T-6MTJ cell mode or an 8T-8MTJ cell mode, may be employed. Further, the number of modes is not limited to 3. It is sufficient if the number of modes is two or more.

The operations executed in the above-mentioned three modes will be described in detail.

(a) 1T-1MTJ Cell Mode

In the 1T-1MTJ cell mode, during read, for example, the word line (selected word line) WL0 is set to "H," and the word line (non-selected word line) WL1 is set to "L." Similarly, the bit line (selected bit line) BL0 is set to "H," and the bit line (non-selected bit line) BL1 is set to "L." Further, the source lines SL0 and SL1 are both set to "L."

The mode selector SEL0 selects the potential $V_{BL0}$ of the bit line BL0, and transfers the potential $V_{BL0}$ to the sense amplifier 2. The mode selector SEL1 selects the reference potential Ref of the bit line BL0, and transfers the reference potential Ref to the sense amplifier 2. The read current Ir is guided into one MTJ element R0 in the selected memory cell MC.

The 1T-1MTJ cell mode is the mode where the cell density is highest between the three modes. In this mode, the read operation is executed by, for example, amplifying the difference between the read current Ir guided into a memory cell (selected memory cell) to access, and the reference current guided into a reference cell.

As aforementioned, the reference cell has a structure in which, for example, a low-resistance MTJ element $R_P$ having a spin in a parallel state (P) and a high-resistance MTJ element $R_{AP}$ having a spin in an anti-parallel state (AP) are connected in parallel. Namely, the resistance $r_{ref}$ resulting from the low-resistance MTJ element $R_P$ and the high-resistance MTJ element $R_{AP}$ is half $(r_P+r_{AP})/2$ the sum of the resistance $r_P$ of the low-resistance MTJ element $R_P$ and the resistance $r_{AP}$ of the high-resistance MTJ element $R_{AP}$.

The read margin is determined from a magnetoresistance ratio (MR ratio) RA, i.e., $(r_{AP}-r_P)/r_P$. However, since in the 1T-1MTJ cell mode, the resistance $r_P$ or $r_{AP}$ of the MTJ element in the selected memory cell is compared with the resistance $(r_P+r_{AP})/2$ of the MTJ element in the reference cell, the substantial MR ratio is half RA.

Accordingly, in this mode, the read delay is significantly great, compared to those in SRAMs. In contrast, regarding the cache capacity (memory capacity), the cell density is approx. four times that in SRAMs, and hence a cache capacity approx. four times that of each SRAM can be realized.

(b) 2T-2MTJ Cell Mode

In the 2T-2MTJ cell mode, during read, for example, the word line (selected word line) WL0 is set to "H," and the word line (non-selected word line) WL1 is set to "L." The bit lines (selected bit lines) BL0 and BL1 are both set to "H." Further, the source lines SL0 and SL1 are both set to "L."

The mode selector SEL0 selects the potential $V_{BL0}$ of the bit line BL0, and transfers the potential $V_{BL0}$ to the sense amplifier 2. The mode selector SEL1 selects the potential $V_{BL1}$ of the bit line BL1, and transfers the potential $V_{BL1}$ to the sense amplifier 2. The read current Ir is guided into two MTJ elements R0 and R1 in the selected memory cell MC.

In the 2T-2MTJ cell mode, a 1-bit datum is stored as a complementary datum in the two MTJ elements R0 and R1. Namely, the sense amplifier 2 executes comparison (differential read) between the current flowing through one (in the high resistance state) of the two MTJ elements R0 and R1, and the current flowing through the other one (in the low resistance state), thereby determining the data stored in a selected memory cell MC. Therefore, no reference cell is required.

Although in this mode, the cache capacity (memory capacity) is half that in the 1T-1MTJ cell mode, it is still approx. twice that in SRAMs. Further, since a read operation is executed without a reference cell, a read margin twice that in the 1T-1MTJ cell mode can be realized, and higher-speed read can be executed. Furthermore, since no reference cell is used, the dynamic power required for read is smaller than in the 1T-1MTJ cell mode.

(c) 4T-4MTJ Cell Mode

In the 4T-4MTJ cell mode, during read, for example, the word lines (selected word lines) WL0 and WL1 are both set to "H." Similarly, the bit lines (selected bit lines) BL0 and BL1 are both set to "H." Furthermore, the source lines SL0 and SL1 are both set to "L."

The mode selector SEL0 selects the potential $V_{BL0}$ of the bit line BL0, and transfers the potential $V_{BL0}$ to the sense amplifier 2. The mode selector SEL1 selects the potential $V_{BL1}$ of the bit line BL1, and transfers the potential $V_{BL1}$ to the sense amplifier 2. The read current Ir is guided into four MTJ elements R0, R1, R2 and R3 in the selected memory cell MC.

The 4T-4MTJ cell mode is used to realize high-speed read. To execute high-speed read, 1-bit data is stored using the four MTJ elements R0, R1, R2 and R3. During read, two word lines WL0 and WL1 are activated. The read current Ir is guided from the sense amplifier 2 to the source lines SL0 and SL1 via four current paths.

Accordingly, in this mode, the read current is twice that in the 2T-2MTJ cell mode, and hence high-speed read can be executed. However, the read current is increased, which inevitably increases the dynamic power used for read. In addition, since 1-bit data is stored using the four MTJ elements R0, R1, R2 and R3, the cell density is ¼ of that in the 1T-1MTJ cell mode. Namely, the capacitor capacity is substantially the same as that in SRAMs.

4. Operation Mechanism (Updating of a Tag Memory)

In this section, a description will be given of the operation mechanism functioning when the above-described variable capacitance STT-MRAM is provided in an L2 cache memory.

Figure 9:
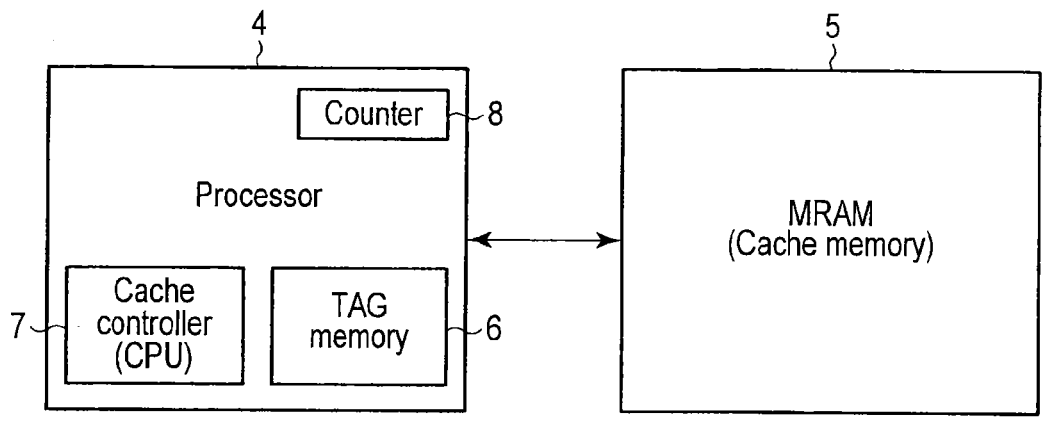
FIG. 9 is a diagram showing a processor system.

FIG. 9 shows a processor system.

A processor 4 temporarily stores, in an MRAM 5, the data used in a currently executed application. The processor 4 comprises a tag memory (RAM) 6 configured to store address information indicating where in the MRAM 5 as a cache memory the data is stored, and history data associated with this data.

When requesting data from the MRAM 5, the processor 4 refers to the tag memory 6 to confirm that the requested data is stored in the MRAM 5 (to hit the data in the MRAM), and then reads the data from the MRAM 5. If it is determined referring to the tag memory 6 that the requested data is not stored in the MRAM 5 (the data is missed), the processor 4 reads data from, for example, a DRAM as a main memory.

In the above-described variable capacitance STT-MRAM, an optimal mode for the currently executed application is selected from a plurality of cell configurations (operation modes). Accordingly, the processor 4 configured to control data writing/reading to/from the MRAM 5 needs to detect in which one of the plurality of modes each datum is stored in the MRAM 5.

To this end, mode information, which is associated with the data stored in the MRAM 5 and indicates in which one of the above-mentioned modes, i.e., (a) the 1T-1MTJ cell mode, (b) the 2T-2MTJ cell mode, and (c) the 4T-4MTJ cell mode, each datum is stored, is additionally stored in the tag memory 6 of the processor 4.

The mode information is updated when the mode switching has been executed.

Table 2 below shows examples of information items stored in the tag memory 6.

TABLE 2

| Tag bits | Description |
|---|---|
| 18 bits | Address information |
| 1 bit | Security information |
| 1 bit | Valid/Invalid information |
| 1 bit | Dirty information |
| 2 bits | Mode information |
| 4 bits | LRU position information |

In the operation mechanism, address information, security information, valid/invalid information, dirty information, mode information and least recent update (LRU) information are stored in the tag memory 6.

The address information indicates that data is stored in the MRAM 5. In this embodiment, the address information is of 18 bits. However, the number of bits will be varied in accordance with the size of one way in the memory cell array.

The security information (1 bit) indicates whether the data in the MRAM is protected by the OS. The valid/invalid information (1 bit) indicates whether the add information is valid or invalid. Namely, address information being valid means data is actually stored in the MRAM 5. Address information being invalid means that the data stored in the MRAM 5 is no more stored at present as a result of ejection from a cache line (history information or ghost information).

The dirty information (1 bit) indicates that the data updated in the MRAM 5 as a cache memory is reflected in a DRAM as a main memory. If the updated data is not reflected in the main memory, processing for reflecting the updated data in the main memory is executed at a predetermined time.

The mode information is newly provided to validate the above-described variable capacitance STT-MRAM. For instance, when the variable capacitance STT-MRAM has the above-mentioned three cell configurations (operation modes)—(a) the 1T-1MTJ cell mode, (b) the 2T-2MTJ cell mode and (c) the 4T-4MTJ cell mode, mode information of 2 bits is provided as shown in Table 2.

The bit number of the mode information varies in accordance with the number of reconfigurable cell configurations. If the number of reconfigurable cell configurations is $2^y$ or less, it can be detected, based on mode information of y bits, in which mode of the $2^y$ modes, each datum is stored in the MRAM 5.

The LRU position information is used to detect whether the data stored in the MRAM 5 is old or new. Since the MRAM 5 as the cache memory always stores new data, it is necessary to sequentially erase (eject), from the MRAM 5, old data, the frequency of use of which is low. To this end, LRU position information is used to detect the relative positional relationship between old and new data.

The data stored in the MRAM 5 earlier will hereinafter be referred to as LRU side data, and the data stored in the MRAM 5 later be referred to as MRU (most recent update) side data.

A cache controller (CPU) 7 incorporated in the processor 4 instructs access of data to the MRAM 5, based on the information stored in the tag memory 6, e.g., information indicating the cell configuration or mode set for each data set incorporated in the memory cell array in the MRAM 5.

Further, a counter 8 in the processor 4 counts the number of times of access to each bit as a determination condition for, for example, adaptive storage control, i.e., mode selection.

Figure 10:
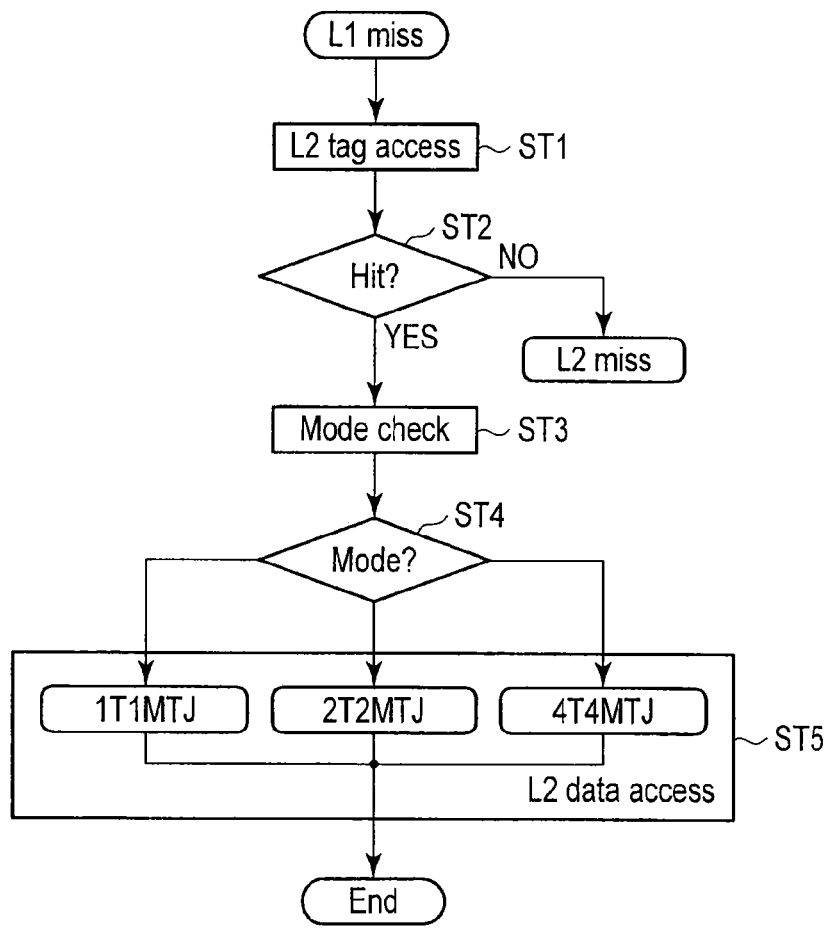
FIG. 10 is a flowchart of mode change.

FIG. 10 is a flowchart of processing executed to access data in the MRAM.

Firstly, if requested data does not exist in an L1 cache memory (L1 miss), it is confirmed referring to the tag memory whether the data exists in the MRAM as the L2 cache memory (step ST1: L2 tag access).

If it is determined that the requested data exists in the MRAM as the L2 cache memory (i.e., if the requested data is hit), it is determined, based on the mode information in the tag memory, in which mode the data was stored in the MRAM (steps ST3 and ST4).

Subsequently, based on the mode information, data is read from the MRAM as the L2 cache memory by switching the read method as shown in FIG. 8 (step ST5: L2 data access).

In contrast, if it is determined that the MRAM as the L2 cache memory does not contain the requested data (L2 miss), processing (Ghost hit) for checking whether there is data indicating that the data was once stored in the MRAM is executed, and then the data is read from the main memory.

5. Adaptive Storage Control (ASC)

In this section, adaptive storage control for making best use of the above-described variable capacitance STT-MRAM will be described. In the adaptive storage control, the cache capacity of the variable capacitance STT-MRAM is varied in accordance with a currently executed application, using a counter configured to predict a pattern of access to the variable capacitance STT-MRAM.

In this control, a two-level cache hierarchy is assumed. As an L21 cache memory, an SRAM is used, and as an L2 cache memory, the variable capacitance STT-MRAM is used. In the variable capacitance STT-MRAM, the memory capacity (cache capacity) and the operation speed (latency) are in a tradeoff relationship.

Accordingly, if the memory capacity is increased, the operation speed is reduced. In this case, however, since the memory capacity is large, the probability of non-existence of data in the L2 cache memory, i.e., miss ratio, is reduced. In contrast, if the memory capacity is reduced, the operation speed is increased. Since in this case, the memory capacity is small, the probability of non-existence of data in the L2 cache memory, i.e., miss ratio, is increased.

If a cache miss has occurred in a last level cache LLC, it is necessary to access the main memory as an off-chip memory to acquire data therefrom. This is a great penalty in view of both power saving and latency. In the MRAM as the L2 cache memory, such a penalty can be avoided and the cache performance be maximized if an optimal cache capacity is selected.

Figure 11:
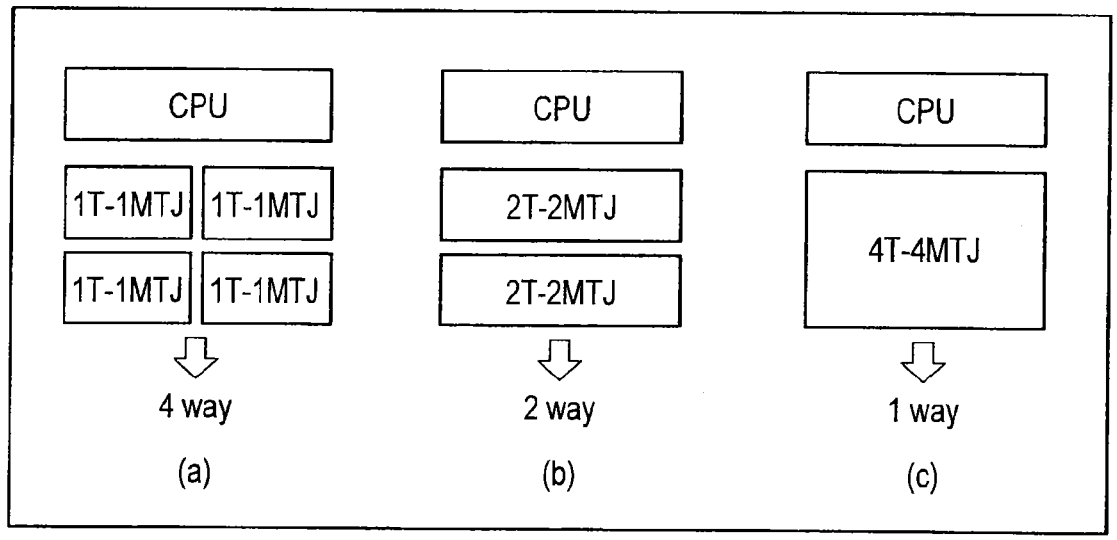
FIG. 11 is a diagram showing a relationship between a cell configuration and a number of ways.

FIG. 11 shows a relationship between the cell configuration (operation mode) and the number of ways.

The cell configuration and the way number are controlled by, for example, the cache controller (CPU). The way number means the number of cache lines made to correspond to one block size of the MRAM cache. The larger the way number, the smaller the number of times of data competition, and the higher the ratio of hitting. Namely, miss penalty is reduced.

If 4 ways are adopted in the 1T-1MTJ cell mode, two ways are adopted in, for example, the 2T-2MTJ cell mode, and one way is adopted in the 4T-4MTJ cell mode.

By thus performing adaptive storage control, the performance of the cache memory can be maximized.

Figure 12:
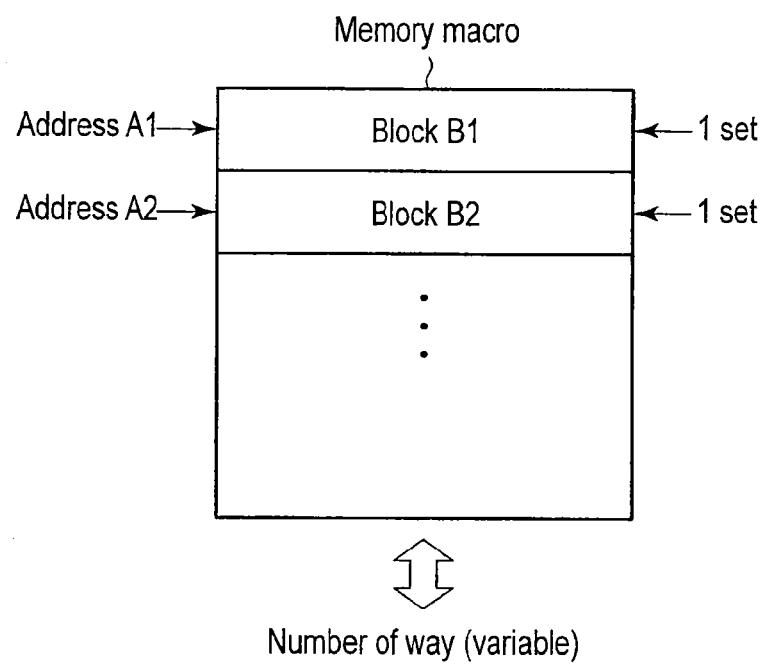
FIG. 12 is a diagram showing a relationship between a data set, a block and a memory macro.

Alternatively, the way number in the MRAM (cache memory) may be made variable for each block in a memory macro as shown in FIG. 12, thereby enabling selection of an optimal way number corresponding to an access pattern for each block.

6. Optimal Storage Prediction for Adaptive Storage Control

In adaptive storage control, an optimal L2 cache size is automatically determined in accordance with, for example, a currently executed application. To predict the tendency of access of the application to an MRAM cache, a counter, for example, is utilized.

Figure 13:
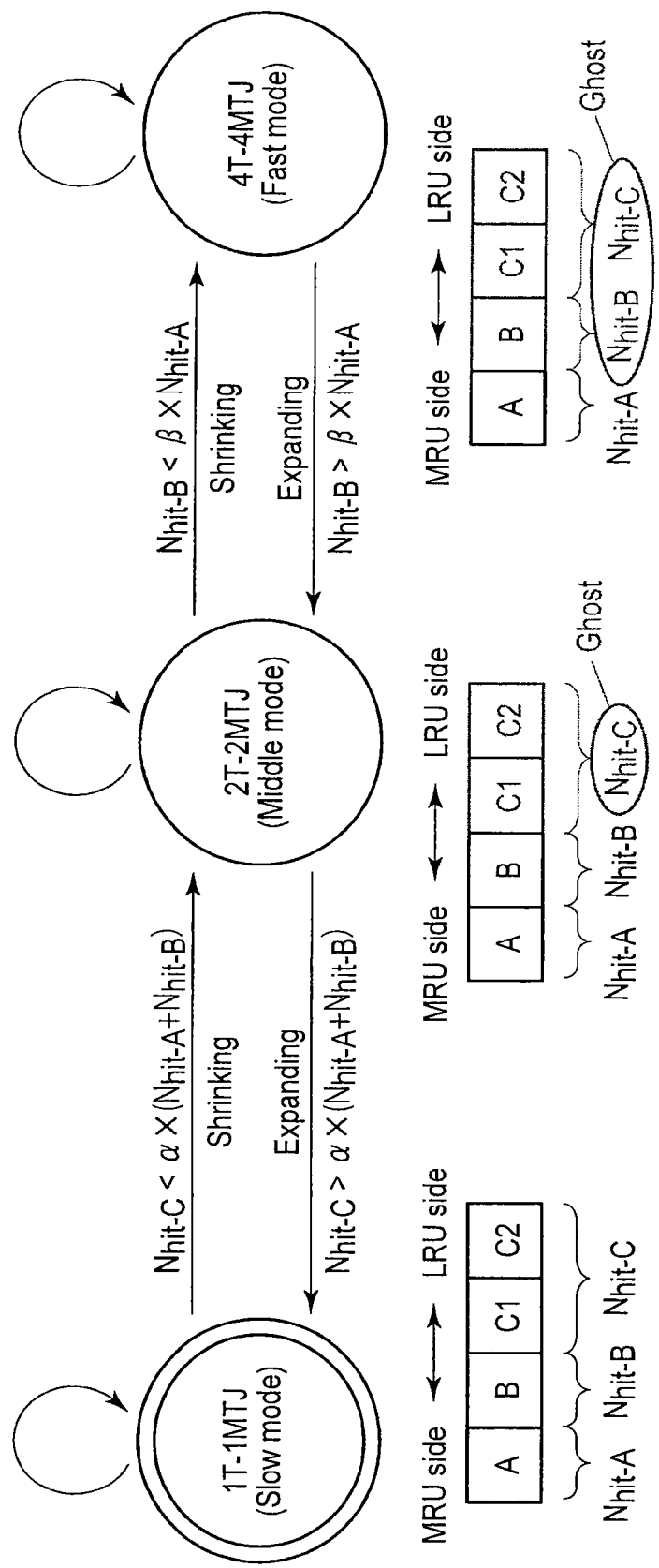
FIG. 13 is a diagram showing a principle of optimal capacitance prediction.

Mode switching is executed between two processes of "Expanding of cache capacity" and "Shrinking of cache capacity." FIG. 13 shows the flow of the mode switching. The condition for executing "Expanding of cache capacity" is that the advantage of expanding the cache capacity is greater than the disadvantage of the same.

An index, "Avoidable misses×L2 miss penalty," for example, can be used as that indicating the degree of advantage of expanding the cache capacity. Similarly, an index, "Current hits×Expanding hit penalty," can be used as that indicating the degree of disadvantage of expanding the cache capacity.

The term "Avoidable misses" represents the number of misses that can be avoided by the expansion of the cache capacity. The term "L2 miss penalty" represents the operation delay and energy that will be caused by access to the main memory due to misses in the L2 cache memory (MRAM).

Further, the term "Current hits" represents the number of hits resulting from the expansion of the cache capacity. The term "Expanding hit penalty" represents the operation delay and energy that will be caused by each hit resulting from the expansion of the cache capacity.

The factors "L2 miss penalty" and "Expanding hit penalty" are varied in accordance with the processor structure.

Table 3 shows an example of the processor structure.

TABLE 3

| MRAM (L2 cache) | 512 KB/1 MB/2 MB, 4-/8-/16-way set associative, 64B block size, 13-/15-/18-cycle hit latency (MRAM write latency is 16 cycles), write-back |
|---|---|
| Main memory | 2 GB, 100-cycle latency |

In the optimal storage prediction, the MRAM (L2 cache memory) selects one of the three cell modes—the 1T-1MTJ cell mode, the 2T-2MTJ cell mode and the 4T-4MTJ cell mode. The way number can be set for each set (set associative), the write latency is 16 cycles, and the block size is 64 bytes. Further, a write back system, in which even when data has been updated in the MRAM cache, this update is not directly reflected in the main memory, is employed.

<1T-1MTJ cell mode (Slow mode)>
Memory capacity: 2 Mbytes;
Way number: 16;
Read latency (hit latency): 18 cycles
<2T-2MTJ cell mode (Middle mode)>
Memory capacity: 1 Mbytes;
Way number: 8;
Read latency (hit latency): 15 cycles
<4T-4MTJ cell mode (Fast mode)>
Memory capacity: 512 Kbytes;
Way number: 4;
Read latency (hit latency): 13 cycles In contrast, the DRAM as the main memory is constructed such that, for example, the memory capacity is 2 Gbytes and the hit latency is 100 cycles.

The hit latencies (operation delays) 18, 15 and 13 in the MRAM cache are included in "Expanding hit penalty." Further, the latency (operation delay) of 100 cycles in the main memory is included in "L2 miss penalty."

An example of determining an optimal L2 cache size will be described referring to FIG. 13.

In this example, $N_{hit-A}$, $N_{hit-B}$ and $N_{hit-C}$ are counted using a counter, to thereby select one of the three cell modes, i.e., 1T-1MTJ cell mode (Slow mode), 2T-2MTJ cell mode (Middle mode) and 4T-4MTJ cell mode (Fast mode).

In FIG. 13, areas A, B, C1 and C2 indicate basic units for storing 1 datum.

$N_{hit-A}$ represents the frequency of access to the area A nearest to the MRU (Most recent update) side among the four areas A, B, C1 and C2. $N_{hit-B}$ represents the frequency of access to the area B second nearest to the MRU (Most recent update) side among the four areas A, B, C1 and C2. $N_{hit-C}$ represents the frequency of access to the areas C1 and C2 on the LRU (Least recent update) side among the four areas A, B, C1 and C2.

The frequency of access means, for example, the number of times of access within a predetermined period. Further, $N_{hit-C}$ represents the average or sum of the frequencies of access to the two areas C1 and C2.

Switching from the 1T-1MTJ Cell Mode to the 2T-2MTJ Cell Mode

In the 1T-1MTJ cell mode, different data are stored in the four areas A, B, C1 and C2. In this state, if, for example, $N_{hit-C} < \alpha \times (N_{hit-A} + N_{hit-B})$, the cache controller (CPU) switches the cell mode from the 1T-1MTJ cell mode to the 2T-2MTJ cell mode. Namely, the cache capacity (memory capacity) is shrunk.

The above conditional inequation means that since the sum $(\alpha \times (N_{hit-A} + N_{hit-B}))$ of the frequencies of access to the two areas A and B is greater than the frequency $N_{hit-C}$ of access to the other two areas C1 and C2, the degree of the advantage of shrinking the cache capacity (decrease of latency of data stored in the two areas A and B) is greater than that of the disadvantage of shrinking the cache capacity (increase of the access time required to access the data, stored in the two areas C1 and C2, from the main memory).

$\alpha$ in the above conditional inequation is an index for determining which has a greater degree between the advantage and the disadvantage. Specifically, this index is used to determine the difference between the sum of the frequencies of access to the two areas A and B and the frequency of access to the two areas C1 and C2. This index is determined based on, for example, the processor system, or the application executed in the system.

Switching from the 2T-2MTJ Cell Mode to the 4T-4MTJ Cell Mode

In the 2T-2MTJ cell mode, different data are stored in substantially two areas A and B. For instance, 1 datum (=two complementary bits) is stored over two areas A and C1, and 1 datum (=two complementary bits) is stored over two areas B and C2. "1 datum" means one datum that provides one meaning.

Namely, in the 2T-2MTJ cell mode, the data stored in the two areas C1 and C2 in the 1T-1MTJ cell mode are erased. However, information associated with the data stored in the two areas C1 and C2 in the 1T-1MTJ cell mode is stored as history information (ghost information) in the tag memory.

In this state, if, for example, $N_{hit-B} < \beta \times (N_{hit-A})$, the cache controller (CPU) switches the cell mode from the 2T-2MTJ cell mode to the 4T-4MTJ cell mode. Namely, the cache capacity (memory capacity) is shrunk.

This conditional inequation means that since the frequency $(\beta \times N_{hit-A})$ of access to one area A is greater than the frequency $N_{hit-B}$ of access to one area B, the degree of the advantage of shrinking the cache capacity (decrease of latency of the datum stored in the one area A) is greater than that of the disadvantage of shrinking the cache capacity (increase of the access time required to access the datum, stored in the one area B, from the main memory).

β in the above conditional inequation is an index for determining which has a greater degree between the advantage and the disadvantage. Specifically, this index is used to determine the difference between the frequency of access to the one area A and the frequency of access to the one area B. This index is determined based on, for example, the processor system, or the application executed in the system.

Switching from the 4T-4MTJ Cell Mode to the 2T-2MTJ Cell Mode

In the 4T-4MTJ cell mode, 1 datum is stored in substantially one area A. For instance, 1 datum (=two complementary bits) is stored over two areas A and C1, and the same datum (=the same two complementary bits) is stored over two areas B and C2.

Namely, in the 4T-4MTJ cell mode, the data stored in the two areas C1 and C2 in the 1T-1MTJ cell mode are erased, and the datum stored in the one area B in the 2T-2MTJ cell mode is erased. However, information associated with the data stored in the three areas B, C1 and C2 is stored as history information (ghost information) in the tag memory.

In this state, if, for example, $N_{hit-B} > \beta \times (N_{hit-A})$, the cache controller (CPU) switches the cell mode from the 4T-4MTJ cell mode to the 2T-2MTJ cell mode. Namely, the cache capacity (memory capacity) is expanded.

This conditional inequation means that since the frequency ($\beta \times N_{hit-A}$) of access to one area A is lower than the frequency $N_{hit-B}$ of access to one area B, the degree of the advantage of expanding the cache capacity (decrease of the access time due to the fact that the data stored in the two areas A and B becomes accessible from the cache memory) is greater than that of the disadvantage of expanding the cache capacity (increase of latency of the data stored in the two areas A and B).

β in the above conditional inequation is an index for determining which has a greater degree between the advantage and the disadvantage. Specifically, this index is used to determine the difference between the frequency of access to the one area A and the frequency of access to the one area B. This index is determined based on, for example, the processor system, or the application executed in the system.

Switching from the 2T-2MTJ Cell Mode to the 1T-1MTJ Cell Mode

In the 2T-2MTJ cell mode, different data are stored in substantially two areas A and B. For instance, 1 datum (=two complementary bits) is stored over two areas A and C1, and 1 datum (=two complementary bits) is stored over two areas B and C2.

Namely, in the 2T-2MTJ cell mode, the data stored in the two areas C1 and C2 in the 1T-1MTJ cell mode are erased. However, information associated with the data stored in the two areas C1 and C2 is stored as history information (ghost information) in the tag memory.

In this state, if, for example, $N_{hit-C} > \alpha \times (N_{hit-A} + N_{hit-B})$, the cache controller (CPU) switches the cell mode from the 2T-2MTJ cell mode to the 1T-1MTJ cell mode. Namely, the cache capacity (memory capacity) is expanded.

This conditional inequation means that since the sum ($\alpha \times (N_{hit-A}, N_{hit-B})$) of the frequencies of access to the two areas A and B is lower than the frequency $N_{hit-C}$ of access to the other two areas C1 and C2, the degree of the advantage of expanding the cache capacity (decrease of the access time due to the fact that the data stored in the four areas A, B, C1 and C2 becomes accessible from the cache memory) is greater than that of the disadvantage of expanding the cache capacity (increase of latency of the data stored in the four areas A, B, C1 and C2).

α in the above conditional inequation is an index for determining which has a greater degree between the advantage and the disadvantage. Specifically, this index is used to determine the difference between the sum of the frequencies of access to the two areas A and B and the frequency of access to the two areas C1 and C2. This index is determined based on, for example, the processor system, or the application executed in the system.

As described above, mode selection/switching (change of cache capacity) is executed based on the past pattern of access to the MRAM cache, i.e., the relationship in magnitude between $N_{hit-A}$, $N_{hit-B}$ and $N_{hit-C}$.

7. Hardware Configuration of Adaptive Storage Control

Figure 14:
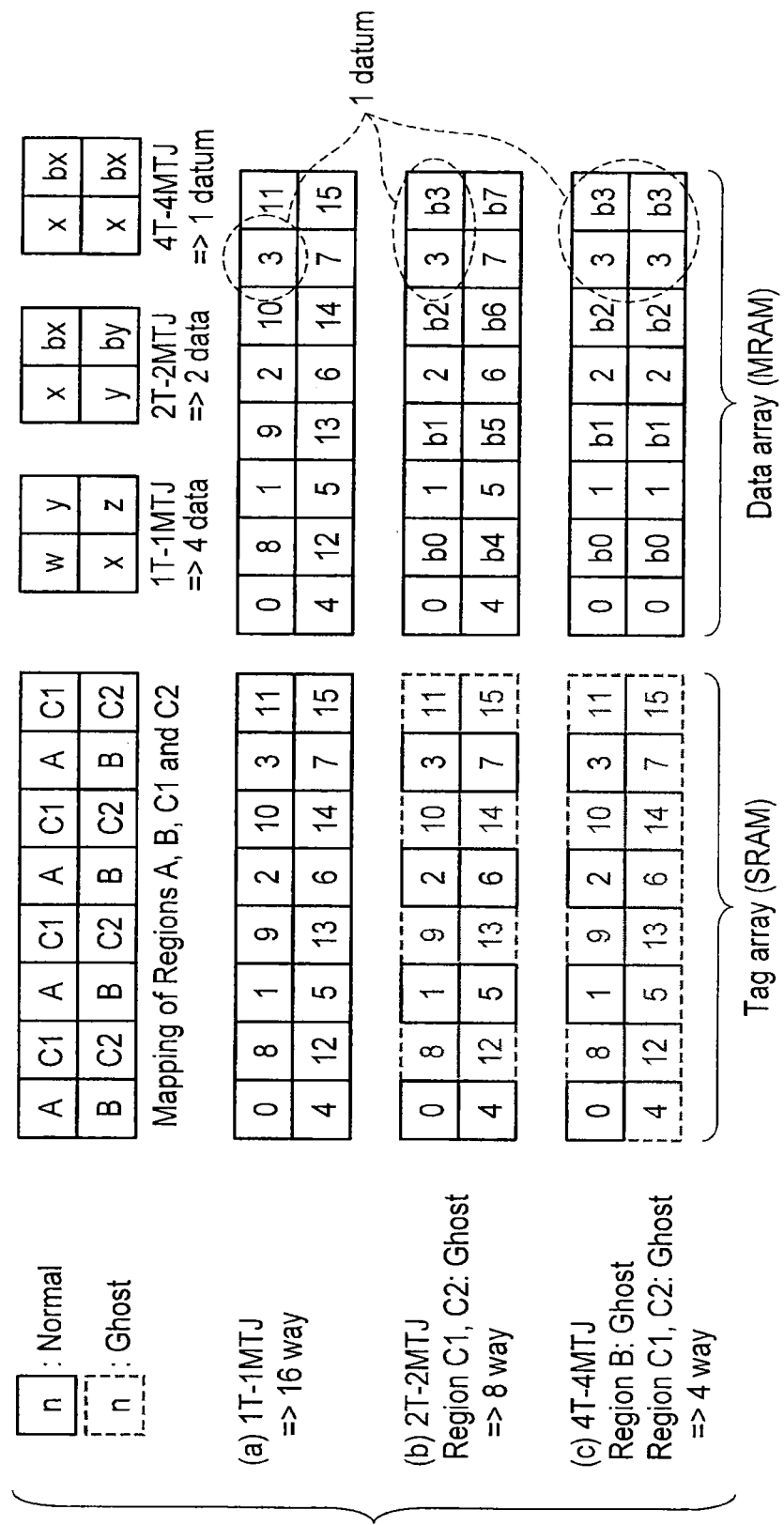
FIG. 14 is a diagram showing a hardware structure for an adaptive capacitance control.

FIG. 14 shows an example of hardware configuration for adaptive storage control.

The tag memory (tag array) is formed of, for example, an SRAM, and a data memory (data array) is formed of, for example, a variable capacitance STT-MRAM (MRAM cache). As aforementioned, the tag memory stores mode information indicating in which mode each datum is stored in the variable capacitance STT-MRAM, in addition to normal tag data.

In the tag memory, the areas A, B, C1 and C2 indicate memory areas for storing tag information included in a datum stored in the MRAM cache. "n" indicates one of the areas A, B, C1 and C2.

"Normal" means an area storing effective data, or an area that is included in a plurality of areas storing the effective data and has stored the effective data so far. Further, "Ghost" means one or more areas that are included in the areas storing the effective data and once stored data other than effective data.

In the hardware configuration, three areas B, C1 and C2 can be used as ghost areas.

In the MRAM cache, areas w, x, y and z indicate memory areas each for storing 1 datum. "bx" indicates storage of a datum obtained by inverting the datum stored in the area x, and "by" indicates storage of a datum obtained by reversing the datum stored in the area y.

In the MRAM cache, numerical values 0 to 15 mean data. b0, b1, b2, b3, b4, b5, b6 and b7 mean inverted data of data 0, 1, 2, 3, 4, 5, 6 and 7, respectively. In the tag memory, numerical values 0 to 15 mean tag data.

The variable capacitance STT-MRAM mode can be varied simultaneously in the entire memory cell array (the entire memory area), or be varied for each block in the memory cell array (see FIG. 12).

In the 1T-1MTJ cell mode, data 0 to 15 are stored in sixteen areas within the data memory (MRAM). In accordance with this, tag data 0 to 15 corresponding to the data 0 to 15 are stored in sixteen areas in the tag memory.

In the 2T-2MTJ cell mode, data 0 to 7 and b0 to b7 are stored in sixteen areas within the data memory (MRAM). Namely, 1 datum (=two complementary bits) is stored over two areas, 1 datum (two bits) being, for example, 0 and b0, 1 and b1, 2 and b2, 3 and b3, 4 and b4, 5 and b5, 6 and b6, or 7 and b7.

In accordance with the above, tag data 0 to 7 corresponding to the data 0 to 7 are stored as normal data in the 8 areas in the tag memory. Further, tag data 8 to 15 corresponding to data 8 to 15 are stored as ghost data in the 8 areas in the tag memory.

Namely, in the 2T-2MTJ cell mode, although the data 8 to 15 are erased from the data memory, the tag data 8 to 15 corresponding to the data 8 to 15 are held as ghost data in the tag memory.

In the 4T-4MTJ cell mode, for example, data 0 to 3 and b0 to b3 are stored in the sixteen areas in the data memory (MRAM). Namely, 1 datum (=four complementary bits) is stored over four areas, the 1 datum being, for example, (0 and b0)×2, (1 and b1)×2, (2 and b2)×2, or (3 and b3)×2.

In accordance with this, tag data 0 to 3 corresponding to the data 0 to 3 are stored in four areas in the tag memory, and tag data 4 to 15 corresponding to data 4 to 15 are stored in twelve areas in the tag memory.

Namely, in the 4T-4MTJ cell mode, although the data 4 to 15 are erased from the data memory, the tag data 4 to 15 corresponding to the data 4 to 15 are held as ghost data in the tag memory.

Thus, the tag memory always holds all tag data 1 to 16 corresponding to all sixteen data 1 to 16 stored in the sixteen areas, regardless of the operation mode during adaptive storage control. Accordingly, $N_{hit-A}$, $N_{hit-B}$ and $N_{hit-C}$ shown in FIG. 13 can be counted at any time by referring to the tag data.

In the above-described hardware configuration, data mapping is executed in the four areas w, x, y and z of two rows x two columns, thereby realizing three modes (variable capacitance operation). Further, one word line is shared between the memory cells in the two areas w and y, and one word line is shared between the two areas x and z.

By virtue of this structure, memory capacity control can be realized for each data set (each block) incorporated in the memory cell array.

To camouflage overhead in read delay in the MRAM cache and reduce cache miss penalty, the above-described adaptive storage control is very effective. This is because the pattern of access to the MRAM cache varies in accordance with a currently executed application, and even the same benchmark varies in accordance with the phase of the application, too.

In particular, if a state (Dirty state) in which the data in the cache memory is not reflected in the main memory has continued for a long time because of, for example, an unexpected threshing address pattern or a streaming access pattern, the amount of data in the cache memory is increased, which may cause a lot of cache misses.

Since in the above-described adaptive storage control, the cache capacity of the variable capacitance STT-MRAM can be made variable for, for example, each data set (block), the above-mentioned cache misses can be reduced to thereby prevent excessive increase in latency.

8. Data Switching Policy During Mode Change

In adaptive storage control, mode change may cause overhead in both power and performance. When expanding the cache size (cache capacity), the cache controller can smoothly execute mode change, since it is sufficient if redundant data is invalidated. However, when shrinking the cache size, serious performance degradation may occur since it is necessary to retreat effective data from the cache memory.

To avoid this, when shrinking the cache size, it is necessary to determine which data should be retreated from the cache memory. As a policy to be taken when shrinking the cache size (at the time of mode change), the following two policies are possible:

Policy 1: Round-Robin Type Data Selection Policy

The MRU-side data included in all data of the block as a data shuffle target are left, and the LRU-side data therein are discarded. Although in this policy, the penalty due to mode change is greater than in the tournament type polity described below, the hit number of the L2 cache can be maintained at a large number.

Discarding of data is executed when effective data to be maintained in a block has been accessed after it is determined that the cache size should be shrunk. Namely, discarding of data is executed by overwriting, at the time of the access, the effective data on the data to be discarded.

Policy 2: Tournament Type Data Selection Policy

Two data as one pair are selected from all data in a block as a data shuffle target. The MRU-side datum included in the two data is left, and the LRU-side datum is discarded. In this case, the penalty resulting from mode change is smaller than in the above-mentioned round-robin type, but the hit number of the L2 cache may be degraded.

As in the round-robin type, discarding of data is executed when effective data to be maintained in a block has been accessed after it is determined that the cache size should be shrunk. Namely, discarding of data is executed by overwriting, at the time of the access, the effective data on the data to be discarded.

9. Static Adaptive Control

In this control, a description will be given of the performance obtained when the variable capacitance STT-MRAM has been statically controlled.

The variable capacitance STT-MRAM can select which should be preferred between the memory capacity (increase in capacity) and the operation speed (increase in operation speed). In a simple way of use of the variable capacitance STT-MRAM, the memory access pattern of each application planned to be executed is pre-analyzed, and the operation mode of the variable capacitance STT-MRAM is changed based on the analysis result.

For instance, for the application sensitive to L2 cache hit latency, the overhead of the hit latency of the variable capacitance STT-MRAM can be suppressed by selecting the mode in which the access latency is shortest. Further, for the application sensitive to the number of L2 cache misses in which no data exists in the L2 cache, the number of cache misses can be reduced by selecting the mode in which the cache size is enlarged.

It is assumed here that the operating system (OS) can request the cache controller (CPU) to change the operation mode of the variable capacitance STT-MRAM, based on the pattern of access to the L2 cache.

In this case, the capacity of the L2 cache can be changed to, for example, 512 Kbytes in the 4T-4MTJ cell mode, or 1 Mbytes in the 2T-2MTJ cell mode, or 2 Mbytes in the 1T-1MTJ cell mode.

In most applications, the hit ratio is enhanced and the IPC (instruction per cycle) of the CPU is also enhanced, if the capacity of the L2 cache is increased. However, in the case of some benchmarks, the IPC of the CPU may be degraded because the hit latency of the L2 cache becomes long.

In such a case, the performance of the L2 cache can be improved if the mode requiring a small cache capacity is selected, using adaptive storage control. Further, in most benchmarks, the number of times of access to a main memory (e.g., a DRAM) as an off chip can be reduced by increasing the capacity of the L2 cache, thereby reducing the energy per instruction (EPI) of the CPU.

10. Dynamic Adaptive Control

In order to further effectively utilize a feature that the pattern of access to the L2 cache varies in accordance with a currently executed application, a description will now be given of dynamic (adaptive) change of the variable capacitance STT-MRAM mode.

In association with the dynamic mode change, the following two policies are possible:

Policy 1: Mode Change Based on Temporal Granularity

In each benchmark, the pattern of access to the L2 cache varies momentarily. In this policy, the cache controller (CPU) additionally includes, for example, a function of confirming the number of times of access to each of the areas in the memory macro. The number of times of access to each area is counted using, for example, a counter.

After that, mode selection is executed on, for example, a memory macro basis greater than a block basis, utilizing the aforementioned optimal storage prediction for adaptive storage control.

Policy 2: Mode Change Based on Address (Spatial) Granularity

In this policy, the capacity of the variable capacitance STT-MRAM is controlled on, for example, a block basis. Optimal storage prediction for adaptive storage control is executed for each block to change the operation mode for each block. As a result, the cache capacity of a block, which is included in all blocks of the L2 cache and is concentrically accessed, can be increased by mode change (switching). Further, in a block in which no access concentration occurs, a mode for realizing high-speed access, i.e., reduction of the operation delay (latency), can be selected.

Also, in this policy, finer control (mode change) than in the above-mentioned policy 1 is possible, although overhead due to the mode change is increased.

According to a simulation result obtained when dynamic adaptive storage control was executed, it is desirable to execute mode change (switching) for each block to thereby enhance the IPC of the CPU, in association with a benchmark, such as "perl script," "bzip2 compression," "gcc compile" or "Ethernet network controller," wherein the addresses at which data access concentration occur are biased.

Furthermore, if data requiring write-back to a main memory (such as a DRAM) as an off chip exist, it is desirable to write back data to the main memory whenever the mode of the STT-MRAM as the L2 cache is changed.

For instance, in a benchmark, such as "quantum mechanical calculation," wherein the operation phase of an application is frequently changed, mode change is often executed within a short time. In this case, data is written back to the main memory when mode switching is executed.

This is because if updated data is reflected in the main memory by write-through whenever mode switching is executed, increase in energy will be inevitably involved, which degrades the average energy EPI of the CPU.

11. Applied Examples

The magnetic random access memory according to the above-described embodiment can be used as, for example, a cache memory for a power-saved processor.

The processors installed in mobile devices represented by smartphones have recently been made to exhibit high performance. Although these processors are mobile processors, multi-core processors have come to be mainly used as the processors. In such mobile processors of high performance, a problem that the duration of their battery has become short is now conspicuous. Thus, the power consumption of the processors has come to be an important index, as well as the processing performance. Namely, increases in power consumption resulting from increases in chip area have become problematic.

Because of the above, not only "maximum performance" but also "minimum power consumption" are now required for the high-performance mobile processors. The "maximum performance" includes operability with no stress, a graphics function of high performance, etc. The "minimum power consumption" includes a thin body, a low temperature and a long battery duration, etc.

In order to effectively reduce the power consumption of the processor, attention has recently been paid to researches that aim to use a nonvolatile memory, such as a spin transfer torque (STT) MRAM, as a cache memory for the processor. The nonvolatile memory can hold data even when power supply is interrupted, and hence can make, "zero," the power consumption in the standby state.

As well as MRAMs, Phase-change RAMs (PCRAMs), Resistive RAMs (ReRAMs), NAND flash memories, etc., have currently been researched and developed as nonvolatile memories. Among these nonvolatile memories, attention has been paid to, in particular, STT-MRAMs as nonvolatile memories that are closest to practical use. This results from their fast operation (<10 ns) comparable to SRAMs, their high programmable resistance (>$10^{15}$ times), and their high affinity for a low-power CMOS logic process.

Because of the above, the magnetic random access memory according to the above-described embodiments is effectively applicable to a high-performance mobile processor required to simultaneously realize high performance and power saving.

12. Conclusion

The above-described embodiments can realize a magnetic random access memory reconfigurable in memory capacity and operation speed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A processor system comprising:
 a variable capacity memory; and
 a processor which instructs a read/write of one bit to the variable capacity memory,
 wherein the variable capacity memory comprises:
 a memory cell array including basic units, each of the basic units including one cell transistor and one variable resistance element;
 a mode selector switching between first and second modes, the read/write of the one bit executed in $2^n$ basic units (n is an integer) among the basic units in the first mode, the read/write of the one bit executed in $2^m$ basic units (m is an integer, m≠n) among the basic units in the second mode; and
 a control circuit which controls the switching between the first and second modes.

2. The system of claim 1, wherein
the read/write of the one bit is executed in one basic unit among the basic units in the first mode,
the mode selector transfers a reference potential and a read potential to a sense amplifier in the first mode, and
the read potential is determined by a resistance value of the one variable resistance element in the one basic unit.

3. The system of claim 1, wherein
the read/write of the one bit is executed in two basic units among the basic units in the second mode,
the mode selector transfers first and second read potentials to a sense amplifier in the second mode,
complementary data is stored in the two basic units,
the first read potential is determined by a resistance value of the one variable resistance element in one of the two basic units, and
the second read potential is determined by a resistance value of the one variable resistance element in the other of the two basic units.

4. The system of claim 1, wherein
the read/write of the one bit is executed in four basic units among the basic units in the second mode,
the mode selector transfers first and second read potentials to a sense amplifier in the second mode,
complementary data is stored in first and second basic units among the four basic units,
complementary data is stored in third and fourth basic units among the four basic units,
the first read potential is determined by resistance values of the two variable resistance elements in the first and third basic units, and
the second read potential is determined by resistance values of the two variable resistance elements in the second and fourth basic units.

5. The system of claim 1, wherein
the one cell transistor and the one variable resistance element are connected in series, and the one variable resistance element is an MTJ element.

6. The system of claim 1, wherein
the variable capacity memory is provided in an L2 cache.

7. The system of claim 1,
wherein the variable capacity memory is a magnetic random access memory.

8. A processor system comprising:
a variable capacity memory; and
a processor which instructs a read/write of one bit to the variable capacity memory,
wherein the variable capacity memory comprises:
a memory cell array including basic units, each of the basic units including one cell transistor and one variable resistance element;
a mode selector switching between first and second modes, the read/write of the one bit executed in one basic unit among the basic units in the first mode, the read/write of the one bit executed in two basic units among the basic units in the second mode; and
a control circuit which controls the switching between the first and second modes.

9. A processor system comprising:
a variable capacity memory; and
a processor which instructs a read/write of one bit to the variable capacity memory,
wherein the variable capacity memory comprises:
a memory cell array including basic units, each of the basic units including one cell transistor and one variable resistance element;
a mode selector switching between first, second, and third modes, the read/write of the one bit executed in one basic unit among the basic units in the first mode, the read/write of the one bit executed in two basic units among the basic units in the second mode, the read/write of the one bit executed in four basic units among the basic units in the third mode; and
a control circuit which controls the switching between the first, second, and third modes.

10. A processor system comprising:
a variable capacity memory; and
a processor which instructs a read/write of one bit to the variable capacity memory,
wherein the variable capacity memory comprises:
a memory cell array including basic units, each of the basic units including one cell transistor and one variable resistance element;
a mode selector switching between first and second modes, the read/write of the one bit executed in $2^n$ basic units (n is an integer) among the basic units in the first mode, the read/write of the one bit executed in $2^m$ basic units (m is an integer, m≠n) among the basic units in the second mode; and
a control circuit which controls the switching between the first and second modes,
wherein the processor comprises a tag memory which stores tag information, and a controller which instructs the read/write by the first or second mode to the variable capacity memory,
wherein the tag information includes mode information indicating whether the read/write of the one bit is executed by the first or second mode,
wherein the processor determines whether the one bit is stored in the variable capacity memory based on the tag information, and the processor reads the one bit using one of the first and second modes based on the mode information, when the one bit is stored in the variable capacity memory, and
wherein when a first bit as the one bit is stored in $2^n$-first basic units in the first mode, and a second bit as the one bit is stored in $2^n$-second basic units in the first mode, the first bit is stored in $2^m$-first and second basic units in the second mode, the second bit in the $2^n$-second basic units is erased in the second mode, and the tag information related to the first and second bits is stored in the tag memory as ghost information, where $2^m = 2^n \times 2$.

11. The system of claim 10, wherein
a switching from the first mode to the second mode is executed when a conditional expression $N_{hit-B} < \beta \times N_{hit-A}$ is satisfied, and
a switching from the second mode to the first mode is executed when a conditional expression $N_{hit-B} > \beta \times N_{hit-A}$ is satisfied,
where $N_{hit-A}$ represents a frequency of access of the first bit, $N_{hit-B}$ represents a frequency of access of the second bit, β represents a value which determines a difference between the frequency of access of the first bit and the frequency of access of the second bit.

12. The system of claim 11, wherein
the processor comprises a counter which counts values of $N_{hit-A}$ and $N_{hit-B}$, and
the values of $N_{hit-A}$ and $N_{hit-B}$ are updated based on the tag information (including the tag information as the ghost information), when access to the first and second bits occur.

13. The system of claim 10, wherein
bits including the first and second bits in the variable capacity memory are arranged from an MRU side to an LRU side in order of updating; and
the second bit in $2^n$-second basic units to be erased in the second mode is located closer to the LRU side than the first bit.

14. The system of claim 10, wherein
the processor comprises a counter which counts times of access to the one bit stored in the variable capacity memory, and a controller which instructs the read/write by the first or second mode to the variable capacity memory; and
the controller instructs the switching between the first and second modes to the variable capacity memory based on a value of the counter.

15. The system of claim 10, wherein
the processor instructs the switching between the first and second modes to the variable capacity memory based on an application and an operation phase.

16. The system of claim 10, wherein
the variable capacity memory comprises a memory macro including blocks; and
the processor instructs the switching between the first and second modes to the memory macro or one of the blocks.

17. The system of claim 10, wherein
the processor changes a way number of the variable capacity memory based on the switching between the first and second modes.

18. The system of claim 10, wherein
the one cell transistor and the one variable resistance element are connected in series, and the one variable resistance element is an MTJ element.

19. The system of claim 10, wherein
the variable capacity memory is provided in an L2 cache.

20. The system of claim 10,
wherein the variable capacity memory is a magnetic random access memory.

* * * * *